US006631336B2

(12) United States Patent
Jedlitschka

(10) Patent No.: US 6,631,336 B2
(45) Date of Patent: Oct. 7, 2003

(54) NONDESTRUCTIVE METHOD OF QUALITY CONTROL OF HIGH-VOLTAGE SYSTEMS AND DEVICE FOR USE OF THE METHOD

(75) Inventor: Hans Jedlitschka, Chatillon (FR)

(73) Assignee: GE Medical Systems Global Technology Company LLC, Waukesha, WI (US)

( * ) Notice: Subject to any disclaimer, the term of this patent is extended or adjusted under 35 U.S.C. 154(b) by 106 days.

(21) Appl. No.: 09/964,142

(22) Filed: Sep. 25, 2001

(65) Prior Publication Data

US 2002/0040279 A1 Apr. 4, 2002

(30) Foreign Application Priority Data

Sep. 29, 2000 (FR) .............................................. 0012455

(51) Int. Cl.⁷ .......................... G01N 37/00; H03L 7/00; C23C 14/00
(52) U.S. Cl. .............................. 702/81; 702/57; 702/64; 702/65; 702/115; 702/128; 331/1 A; 331/1 R; 331/17; 204/298.03; 204/298.08; 204/298.34; 204/192.15; 204/192.22; 204/191.32
(58) Field of Search ............................. 702/57, 64, 65, 702/81, 115, 128; 331/1 R, 1 A; 204/192.1, 192.12, 298.03, 298.08, 298.34, 192.15, 192.22, 192.32; 216/67, 63, 58; 372/39, 55, 61, 64; 156/345.44

(56) References Cited

FOREIGN PATENT DOCUMENTS

SU          769649       * 10/1980

OTHER PUBLICATIONS

Pat. Abs. of Japan, vol. 1999, No. 10; JP 11–142467, Aug. 31, 1999.*

* cited by examiner

*Primary Examiner*—John Barlow
*Assistant Examiner*—Meagan S. Walling
(74) *Attorney, Agent, or Firm*—Jay L. Chaskin; Cantor Colburn LLP

(57) ABSTRACT

A method and device applicable to HV generators and X-ray tubes, and a computer program and support for the program. In the method a determination is made of a scale of values representing the energy of the radio-frequency spectrum transmitted by radio wave over a given period in the electric discharges appearing in the system for a given test voltage, by artificially varying in the system the level of pollution of the system until dielectric failure of the system. A limiting value is chosen embracing the admissible pollution tolerances on manufacture. A measurement is made for each system of the same product type of the quantity of energy of the radio-frequency spectrum transmitted by radio wave by each of the systems under the same conditions. A comparison is made of the quantities measured with the limiting value chosen to determine a possible fluctuation of quality of the systems produced.

14 Claims, 1 Drawing Sheet

NONDESTRUCTIVE METHOD OF QUALITY CONTROL OF HIGH-VOLTAGE SYSTEMS AND DEVICE FOR USE OF THE METHOD

CROSS REFERENCE TO RELATED APPLICATION

This application claims the benefit of a priority under 35 USC 119 to French Patent Application No. 0012455 filed Sep. 29, 2000, the entire contents of which are incorporated by reference.

BACKGROUND OF THE INVENTION

The present invention concerns, in general, a nondestructive method of production quality control of high-voltage systems (HV systems).

HV systems such as HV generators and X-ray tubes, the service voltages of which can reach values of 100 kV or more, are becoming more and more compact and more and more powerful. These systems therefore release more and more heat, but the electric field density also increases and the operating safety margins of these devices are becoming ever narrower.

The active elements of these HV systems are insulated from one another by dielectric materials and, in particular, by dielectric liquids such as oils. The presents of pollutants in these dielectric materials, oils in particular, are harmful to the insulating qualities of these materials, which is translated on operation of the systems by discharges in these dielectric materials that can result, on subsequent use of these devices, in permanent damage to the systems. The risk of a high-voltage failure of the insulating materials of these systems to the point of permanent damage is direct related to the levels of pollution of the insulating materials after manufacture and, consequently, the rate of discharges likely to occur on subsequent use of the systems.

In HV systems, such as HV generators and X-ray tubes, the high-voltage components of the systems are generally insulated by a dielectric insulating liquid such as an oil, which also serves the function of cooling fluid.

The presence of pollutant in that oil creates, on operation of those systems, electric discharges which can reach the point of permanent damage of the device.

Although these electric discharges can appear in parts of the system other than the insulating liquid, they mainly occur in that liquid, for that liquid is the one most easily polluted in the course of the manufacturing process.

BRIEF DESCRIPTION OF THE INVENTION

The invention concerns, in particular, a nondestructive method of quality control of high-voltage systems, making it possible to quantify the residual level of discharges of a finite HV system.

The invention likewise concerns, in particular, a control method, such as indicated above, making it possible to ensure that HV systems of new design and reduced dimensions also present sufficient operating safety margins.

The invention also concerns, in particular, a method of control suited to final control of the HV systems manufactured, making it possible to select durable high-quality products, while reducing the costs of retreatment of products considered defective.

The invention finally concerns, in particular, a device for use of the above-mentioned method.

In one embodiment of the invention, a nondestructive method of quality control of the production of HV systems comprises:

(a) determining for each type of high-voltage system of a scale of values representing the energy of the radio-frequency (RF) spectrum transmitted by radio wave over a given period by the electric discharges appearing in the system for a given test voltage, by artificially varying in the system the level of pollution of the system until dielectric failure of the system;

(b) choosing on the scale of a limiting value embracing the admissible pollution tolerances on manufacture;

(c) measuring for each system of the same product type of the quantity of energy of the RE spectrum transmitted by radio wave by each of the systems under the same conditions as in stage (a); and (d) comparing of the quantities measured in stage (c) with the limiting value chosen to determine a possible fluctuation of quality of the systems produced.

A nondestructive method of quality control of the production of high-voltage systems can comprise the following steps:

(a) determining for each type of high-voltage system of a scale of values representing the energy of the radio-frequency (RF) spectrum transmitted by radio wave over a given period in the electric discharges appearing in the system for a given test voltage, by artificially varying in the system the level of pollution of the system until dielectric failure of the system;

(b) measuring for each system of the same product type of the quantity of energy of the radio-frequency spectrum transmitted by radio wave by each of the systems under the same conditions as in stage (a); and (c) comparing of the quantities measured in stage (b) with a limiting value chosen to determine a possible fluctuation of quality of the systems produced.

A device making it possible to use such a method for measurement of the energy of the RF spectrum transmitted by the discharges being established in the HV system comprises:

(a) an antenna that can be coupled to an HV output of the high-voltage system and which transmits RF signals representing the discharges being established in the high-voltage system when the latter is fed with a given test supply voltage;

(b) an adapted RF receiver receiving the signals transmitted by the antenna and delivering output signals; and (c) device coupled to the receiver receiving the output signals from the receiver and supplying a signal representing the quantity of energy of the RF spectrum transmitted by radio wave over a given period by the electric discharges appearing in the system for the given test voltage.

The antenna can be made in a high-voltage connector.

A device for measurement of the energy of the RF spectrum transmitted by the discharges being established in a high-voltage system in operation can comprise means for transmission of RF signals representing the discharges being established in the HV system means for an RF reception capable of delivering output signals and means for processing capable of supplying a value representing the energy of the RF spectrum transmitted by radio wave over a given period by the electric discharges appearing in the system for a given test voltage.

The means for processing can comprise a microprocessor, one or more memories, one or more control programs and a communication bus, so that a program stored in a memory can be executed by the microprocessor.

The invention also concerns a computer program comprising program code means for applying the steps of the method, when the program is operating on a computer.

The invention also concerns a support capable of being read by a device for reading program code means which are stored there and are suitable for use of the steps of the method, when the program is operating on a computer.

BRIEF DESCRIPTION OF THE DRAWINGS

The following description refers to the attached figures which respectively represent.

DETAILED DESCRIPTION OF THE INVENTION

The first stage of the method therefore consists of determining for each type of HV system a scale of values representing the energy of the radio-frequency spectrum transmitted by radio wave by the electric discharges appearing in the system on application of the test voltage. To establish that scale, the level of pollution of the insulating liquid of the HV system is gradually increased in known manner and one measures for each increase of pollution level the energy of the radio-frequency spectrum transmitted by the system over a given period for a fixed given voltage applied until dielectric failure of the HV system.

A simple means for increasing the level of pollution of the insulating liquid of an HV system can consist, for example, of gradually adding to it given quantities of alcohol (ethanol) or other substances such as a chemical diluent and of measuring after each addition, on and for a fixed given test voltage, the energy of the radio-frequency spectrum transmitted by radio wave over a fixed given period by the electric discharges until dielectric failure of the system.

Once that scale is established, a limiting value can be chosen on same in accordance with the admissible manufacturing pollution tolerances in order to determine the systems considered reliable and the systems considered unreliable.

That limit value will very clearly depend on the tolerances allowed and may vary from one HV system to another type of HV system.

Once that scale is established, for each production line of a system of the same type, the quantity of energy of the radio-frequency spectrum transmitted by radio wave will then be measured by each of the systems produced, under the same conditions as for establishment of the previous scale and, by comparison of the measured result obtained, it will be determined whether the system thus tested transmits a radio-frequency spectrum of energy less or greater than the limiting value chosen. The fluctuation of quality of a production line of a same HV system can thus be followed and one can act accordingly to remedy any possible drifts.

Figure 1:
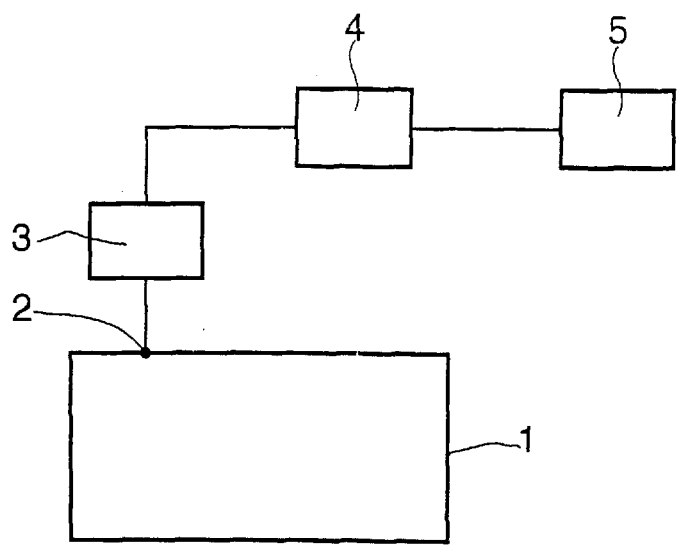
FIG. 1 is a diagram of a device measuring the energy of the RF spectrum transmitted by the discharges of an HV system according to an embodiment of the invention.

Referring to FIG. 1, a device is schematically represented that measures the energy of the RF spectrum transmitted by discharges being established in an HV system for use of the method according to an embodiment of the invention.

That system comprises an antenna 3 that can be coupled to an HV output of an HV system 1, for example, an HV generator. The output of the antenna 3 is connected by a cable or by radio wave to an adapted receiver 4. The output of the receiver 4 is connected to a signal processing device 5.

Figure 2:
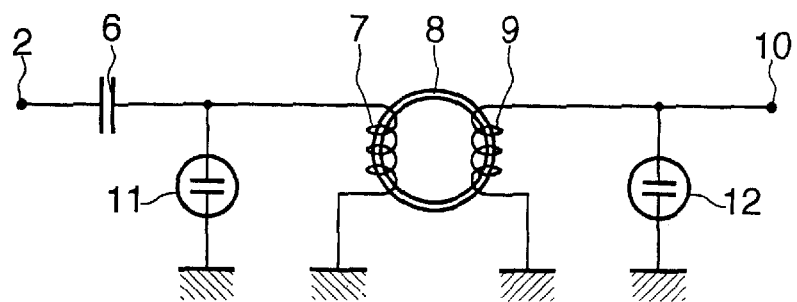
FIG. 2 is a diagram of the electric components of an antenna of the measuring device of FIG. 1.

The principal components of a standard RF antenna are schematically represented in FIG. 2. As the figure shows, that antenna comprises a capacitor 6, one armature of which is connected to the HV output of the HV system and the other armature of which is connected to a primary winding 7 coiled on a ferrite ring 8. A protection diode 11 can likewise be provided at the output of the capacitor 6, as is standard. A secondary winding 9 is also coiled on the ferrite 8 and connected to a radio wave transmission cable 10.

A protection diode 12 can likewise be provided on the radio wave transmission cable 10. The other ends of the windings 7 and 9 are grounded. The capacitor 6 and the primary winding 7 constitute a high-pass filter eliminating the low-frequency ripple of the HV system.

By way of example, the HV capacitor can be a capacitor of 10 to 20 pF that can support voltages of 150 kV+25% and the radio wave transmission cable can be a standard cable of 60 to 75 ohms resistance.

Such an RF antenna structure can be easily made in a standard HV system connector, for example, the capacitor 6 being made of a metal rod connected to the terminal contact of the connector and surrounded by a metal tube connected to the primary winding 7. An antenna that can be directly plugged into the corresponding high-voltage output, for example, of a high-voltage generator, is thus obtained. In the case of a passive system such as an X-ray tube, an antenna of the same type can be used, but it is then necessary to insert between the antenna and the X-ray tube a standard HV multiple connector device which will serve as antenna adapter. Also in the case of a passive device such as an X-ray tube, it is necessary to provide an HV generator feeding the HV tube, which is generally oversized in order to render the discharges of the HV generator negligible in relation to those of the X-ray tube.

Figure 3:
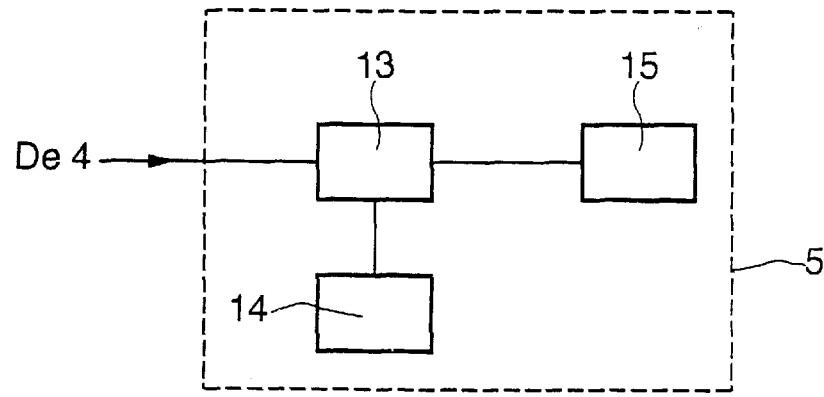
FIG. 3 is a diagram of the means of processing the signals from the device of FIG. 1.

As FIG. 3 shows, the signal processing device 5 comprises a means of integration 13 controlled by a clock 14 and a system of display of the quantity measured 16.

The operation of the measuring device of FIGS. 1 to 3 is now going to be described, in connection with an HV generator. The same operation would apply in the case of a passive device such as an X-ray tube.

When the HV generator 1 is active, the antenna 3 transmits radio-frequency signals representing electric discharges being established in the insulating materials of the HV generator. Those signals, filtered to eliminate low-frequency ripple, are received by the adapted receiver 4. The adapted receiver 4 transmits output signals representing the discharges to the integrator 13 in which those signals are integrated over a period of time determined by the clock 14 in order to supply a signal representing the energy of the radio-frequency spectrum transmitted over the period determined by the electric discharges appearing in the HV system. The output signals of the integrator 13 are received by the recording device 16 for later use.

Various modifications in structure and/or steps and/or function may be made by one skilled in the art without departing from the scope and extent of the invention as recited in the claims.

What is claimed is:

1. A nondestructive method of quality control of the production of HV system comprising the steps of:
   (a) determining for each type of high-voltage system a scale of values representing the energy of the radio-frequency spectrum transmitted by radio wave over a given period by the electric discharges appearing in the system for a given test voltage, by artificially varying in the system the level of pollution of the system until dielectric failure of the system;

(b) choosing on the scale a limiting value embracing the admissible pollution tolerances on manufacture;

(c) measuring for each system of the same product type of the quantity of energy of the radio-frequency spectrum transmitted by radio wave by each of the systems under the same conditions as in step (a); and (d) comparing of the quantities measured in step (c) with the limiting value chosen to determine a possible fluctuation of quality of the systems produced.

2. The method according to claim 1 wherein the high-voltage system is a high-voltage generator or an X-ray tube.

3. The method according to claim 2 wherein the artificial variation of level of pollution of the system is made by gradual addition of given quantities of a pollutant to an insulating liquid of the high-voltage system.

4. The method according to claim 3 wherein the pollutant is an alcohol or other chemical diluent.

5. The method according to claim 1 wherein the artificial variation of level of pollution of the system is made by gradual addition of given quantities of a pollutant to an insulating liquid of the high-voltage system.

6. The method according to claim 5 wherein the pollutant is an alcohol or other chemical diluent.

7. A nondestructive method of quality control of the production of high-voltage systems comprising the steps of:

(a) determining for each type of high-voltage system a scale of values representing the energy of the radio-frequency spectrum transmitted by radio wave over a given period in the electric discharges appearing in the system for a given test voltage, by artificially varying in the system the level of pollution of the system until dielectric failure of the system;

(b) measuring for each system of the same product type of the quantity of energy of the radio-frequency spectrum transmitted by radio wave by each of the systems under the same conditions as in step (a); and (c) comparing of the quantities measured in step (b) with a limiting value chosen to determine a possible fluctuation of quality of the systems produced.

8. A device for measurement of the energy of the RF spectrum transmitted by the discharges being established in a high-voltage system comprising:

(a) an antenna that can be coupled to an HV output of the high-voltage system and transmitting RF signals representing the discharges being established in the HV system;

(b) an adapted RF receiver receiving the signals transmitted by the antenna and delivering output signals; and (c) a processing device coupled to the receiver receiving the output signals from the receiver and supplying a quantity representing the energy of the RF spectrum transmitted by radio wave over a given period by the electric discharges appearing in the system for a given test voltage.

9. The device according to claim 8 wherein the antenna is made in a high-voltage connector.

10. A device for measurement of the energy of the RF spectrum transmitted by the discharges being established in a high-voltage system comprising:

(a) means for transmission of RF signals representing the discharges being established in the HV system;

(b) means for RF reception capable of delivering output signals; and (c) means for processing capable of supplying a value representing the energy of the RF spectrum transmitted by radio wave over a given period by the electric discharges appearing in the system for a given test voltage.

11. A computer program comprising program code for applying when the program is operating on a computer the steps comprising:

(a) determining for each type of high-voltage system a scale of values representing the energy of the radio-frequency spectrum transmitted by radio wave over a given period by the electric discharges appearing in the system for a given test voltage, by artificially varying in the system the level of pollution of the system until dielectric failure of the system;

(b) choosing on the scale a limiting value embracing the admissible pollution tolerances on manufacture;

(c) measuring for each system of the same product type of the quantity of energy of the radio-frequency spectrum transmitted by radio wave by each of the systems under the same conditions as in step (a); and (d) comparing of the quantities measured in step (c) with the limiting value chosen to determine a possible fluctuation of quality of the systems produced.

12. A computer program comprising program code for applying when the program is operating on a computer comprising:

(a) determining for each type of high-voltage system a scale of values representing the energy of the radio-frequency spectrum transmitted by radio wave over a given period in the electric discharges appearing in the system for a given test voltage, by artificially varying in the system the level of pollution of the system until dielectric failure of the system;

(b) measuring for each system of the same product type of the quantity of energy of the radio-frequency spectrum transmitted by radio wave by each of the systems under the same conditions as in step (a); and (c) comparing of the quantities measured in step (b) with a limiting value chosen to determine a possible fluctuation of quality of the systems produced.

13. Support capable of being read by a device for reading means for program code which are stored therein comprising:

(a) determining for each type of high-voltage system a scale of values representing the energy of the radio-frequency spectrum transmitted by radio wave over a given period by the electric discharges appearing in the system for a given test voltage, by artificially varying in the system the level of pollution of the system until dielectric failure of the system;

(b) choosing on the scale a limiting value embracing the admissible pollution tolerances on manufacture;

(c) measuring for each system of the same product type of the quantity of energy of the radio-frequency spectrum transmitted by radio wave by each of the systems under the same conditions as in step (a); and (d) comparing of the quantities measured in step (c) with the limiting value chosen to determine a possible fluctuation of quality of the systems produced.

14. Support capable of being read by a device for reading means for program code which are stored therein and are suitable for use of the steps of the method comprising:

(a) determining for each type of high-voltage system a scale of values representing the energy of the radio-frequency spectrum transmitted by radio wave over a given period in the electric discharges appearing in the system for a given test voltage, by artificially varying in the system the level of pollution of the system until dielectric failure of the system;

(b) measuring for each system of the same product type of the quantity of energy of the radio-frequency spectrum transmitted by radio wave by each of the systems under the same conditions as in step (a); and (c) comparing of the quantities measured in step (b) with a limiting value chosen to determine a possible fluctuation of quality of the systems produced.

* * * * *